United States Patent
Saito

(10) Patent No.: US 7,564,049 B2
(45) Date of Patent: Jul. 21, 2009

(54) PATTERN DRAWING SYSTEM, ELECTRICALLY CHARGED BEAM DRAWING METHOD, PHOTOMASK MANUFACTURING METHOD, AND SEMICONDUCTOR DEVICE MANUFACTURING METHOD

(75) Inventor: Masato Saito, Machida (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 427 days.

(21) Appl. No.: 11/434,258

(22) Filed: May 16, 2006

(65) Prior Publication Data

US 2006/0281198 A1    Dec. 14, 2006

(30) Foreign Application Priority Data

May 16, 2005   (JP)   ............... 2005-142701

(51) Int. Cl.
*H01J 37/302*   (2006.01)
*H01J 37/304*   (2006.01)

(52) U.S. Cl. .............. 250/492.22; 250/492.1; 250/492.2; 250/492.23; 250/493.1

(58) Field of Classification Search ............... None
See application file for complete search history.

(56) References Cited

U.S. PATENT DOCUMENTS

| | | | | |
|---|---|---|---|---|
| 4,943,730 A * | 7/1990 | Takemura et al. | ......... | 250/492.3 |
| 5,008,553 A * | 4/1991 | Abe | ......... | 250/492.2 |
| 5,051,598 A * | 9/1991 | Ashton et al. | ......... | 250/492.2 |
| 5,241,185 A * | 8/1993 | Meiri et al. | ......... | 250/492.2 |
| 5,283,440 A * | 2/1994 | Sohda et al. | ......... | 250/492.2 |
| 5,305,225 A * | 4/1994 | Yamaguchi et al. | ......... | 700/160 |
| 5,313,068 A * | 5/1994 | Meiri et al. | ......... | 250/492.22 |
| 5,451,487 A * | 9/1995 | Abe et al. | ......... | 430/296 |
| 5,863,682 A * | 1/1999 | Abe et al. | ......... | 430/30 |
| 6,035,113 A * | 3/2000 | Gerber et al. | ......... | 716/19 |
| 6,337,164 B1 * | 1/2002 | Nakasuji | ......... | 430/30 |
| 6,346,354 B1 * | 2/2002 | Abe et al. | ......... | 430/30 |
| 6,373,071 B1 * | 4/2002 | Innes et al. | ......... | 250/492.22 |
| 6,528,806 B1 * | 3/2003 | Kawamura | ......... | 250/492.22 |
| 6,555,817 B1 * | 4/2003 | Rohde et al. | ......... | 250/311 |
| 6,835,511 B2 * | 12/2004 | Hirayanagi | ......... | 430/22 |
| 6,835,942 B2 * | 12/2004 | Magoshi et al. | ......... | 250/492.22 |
| 6,845,497 B2 * | 1/2005 | Murai et al. | ......... | 716/20 |
| 7,098,464 B2 * | 8/2006 | Sohda et al. | ......... | 250/491.1 |
| 7,186,976 B2 * | 3/2007 | Dean et al. | ......... | 250/310 |
| 2008/0067446 A1 * | 3/2008 | Belic et al. | ......... | 250/492.22 |

FOREIGN PATENT DOCUMENTS

JP    2003-133209    5/2003

* cited by examiner

*Primary Examiner*—David A. Vanore
(74) *Attorney, Agent, or Firm*—Finnegan, Henderson, Farabow, Garrett & Dunner, L.L.P.

(57) ABSTRACT

A pattern drawing system includes a beam irradiating mechanism which irradiates electrically charged beams on a film to be drawn, a coefficient calculating section which calculates a backward scattering coefficient relevant to a drawing pattern in the film to be drawn, based on an approximating function for approximating a relationship between a global coating rate of the drawing pattern and a backward scattering coefficient of the electrically charged beams in the film to be drawn, and based on the global coating rate of the drawing pattern, and an irradiation quantity calculating section which calculates an electrically charged beam irradiation quantity used for drawing the pattern using an electrically charged beams irradiating mechanism, based on the backward scattering coefficient of the pattern.

14 Claims, 4 Drawing Sheets

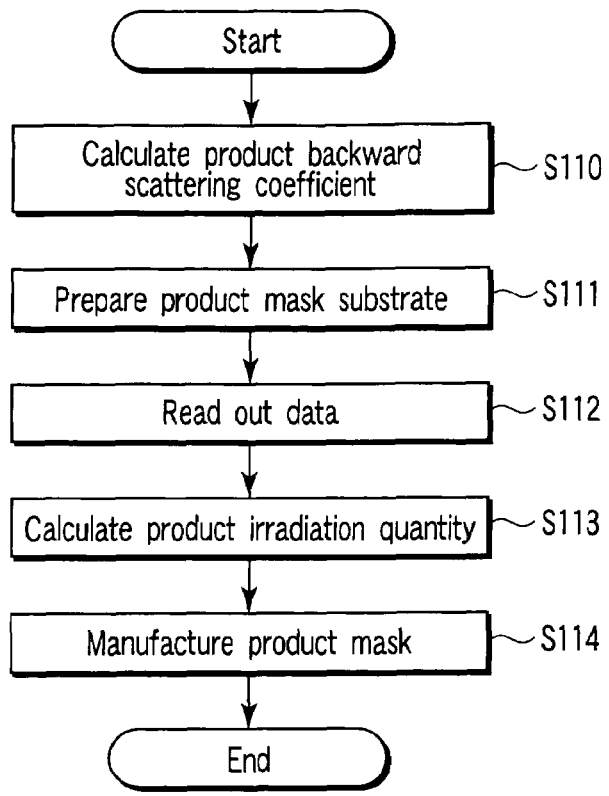
F I G. 4
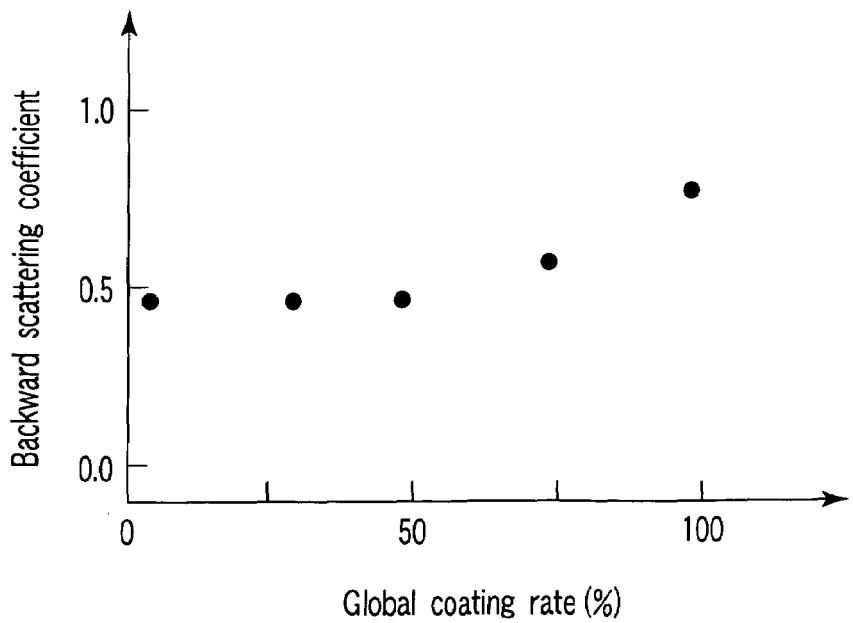
F I G. 5

PATTERN DRAWING SYSTEM, ELECTRICALLY CHARGED BEAM DRAWING METHOD, PHOTOMASK MANUFACTURING METHOD, AND SEMICONDUCTOR DEVICE MANUFACTURING METHOD

CROSS-REFERENCE TO RELATED APPLICATIONS

This application is based upon and claims the benefit of priority from prior Japanese Patent Application No. 2005-142701, filed May 16, 2005, the entire contents of which are incorporated herein by reference.

BACKGROUND OF THE INVENTION

1. Field of the Invention

The present invention relates to an electrically charged beam drawing technique for use in manufacturing a semiconductor device, and particularly to a pattern drawing system using an electrically charged beam by introducing a proximity effect correcting technique, an electrically charged beam drawing method, a photomask manufacturing method, and a semiconductor device manufacturing method.

2. Description of the Related Art

When forming a photomask used for manufacturing a semiconductor device, for example, a resist film applied on a mask substrate is irradiated with electron beams or electrically charged beams, and a mask pattern is graphically drawn on the resist film. The electron beams incident to the resist film at the time of this drawing transmit through this resist film, and are reflected from the mask substrate. Thus, the incident electrons are scattered. By these scattered electrons, the resist film is exposed again. The exposure by the scattered electrons covers a resist film beyond the contour of a preset drawing range using the incident electron beams and has an effect such as dimensional change on a pattern formed at the periphery of a drawn pattern. This phenomenon is known as a "proximity effect". In this case, with respect to the electron irradiation quantity at an arbitrary drawing position on the resist film, the irradiation quantity of the scattered electrons incident at the drawing of another peripheral patterns is added to the set irradiation quantity. Therefore, in response to a coating rate of another peripheral patterns formed in a range in which the proximity effect is attained, an effective irradiation quantity at the drawing position changes, and a dimensional change such as pattern enlargement occurs with a mask pattern to be formed.

A method for restricting the proximity effect includes an "irradiation quantity correcting method" for restricting a dimensional change by changing an irradiation quantity of electrically charged beams at the drawing position so as to compensate for the irradiation quantity of the scattered electrons among the adjacent patterns. Conventionally, there has been a problem that the irradiation quantity correcting method requires a long calculation time because the coating rate of the peripheral patterns is calculated, and then, the irradiation quantity at the drawing position is calculated. However, in recent years, with the improvement of computer's calculation processing capability, the correction of an irradiation quantity has been successfully carried out in almost real time. This irradiation quantity correcting method has been widely used as a proximity effect correcting method.

On the other hand, there is a dimensional change factor of a pattern that depends on a pattern coating rate of a region wider than a region in which the proximity effect is attained. For example, there is a "fogging effect" that the electron beams reflected from a mask substrate are reflected again on a structure of a drawing device such as an objective lens, and the resist film is exposed again. The fogging effect caused by the reflected electron beams cover a wider range than that in the proximity effect. For example, in the case where a resist film is coated on a glass substrate, the range encompassed by the proximity effect is about 10 μm while the range encompassed by the fogging effect is about 1 cm. Therefore, when the irradiation quantity correcting method is employed to restrict a dimensional change caused by the fogging effect, a region for calculating a pattern coating rate is very large as compared with a region of the proximity effect, thus requiring a tremendously large amount of calculation time even with the recent computer's calculation processing capability. Thus, in order to more simply restrict a dimensional change factor such as a fogging effect whose range is wider than that of the proximity effect, there has been proposed a method for partitioning the whole drawing region into partitions, and then, adjusting the irradiation quantity in a unit partition in response to a pattern coating rate of patterns included in the unit partition.

Further, there has been proposed a method for applying, at the same time, both of: a correcting method capable of restricting a dimensional change factor that depends on a pattern coating rate in a narrow range, such as proximity effect correction; and a correcting method capable of restricting a dimensional change factor that depends on a pattern coating rate of a wide range, such as the fogging effect correction (see, for example, Jpn. Pat. Appln. KOKAI Publication No. 2003-133209). However, there has been a problem that a correction error rather increases more significantly due to a synergetic effect of proximity effect correction and fogging effect correction.

BRIEF SUMMARY OF THE INVENTION

According to a first aspect of the present invention, there is provided a pattern drawing system, comprising: an electrically charged beam irradiating mechanism; a coefficient calculating section which, based on an approximating function for approximating a relationship between a global pattern coating rate in a range wider than that of a proximity effect and a backward scattering coefficient and based on the global pattern coating rate, calculates the backward scattering coefficient of the pattern; and an irradiation quantity calculating section which, based on the backward scattering coefficient of the pattern, calculates a beam irradiation quantity used for drawing the pattern using the electrically charged beams.

According to a second aspect of the present invention, there is provided an electrically charged beam drawing method, comprising: calculating a backward scattering coefficient of a product pattern based on: an approximating function for approximating a relationship between a global pattern coating rate and the backward scattering coefficient; and the global pattern coating rate of the product pattern; calculating a product irradiation quantity condition for use in drawing the product pattern based on the backward scattering coefficient of the product pattern; and drawing the product pattern by using the product irradiation quantity condition.

According to a third aspect of the present invention, there is provided a photomask manufacturing method, comprising: calculating a backward scattering coefficient of a product pattern based on: an approximating function for approximating a relationship between a global coating rate and the backward scattering coefficient; and the global coating rate of the product patter; coating a product resist film on a product mask substrate coated with a product light interrupt film; irradiating the product resist film and forming a product resist pattern under a product irradiation quantity condition calculated based on the backward scattering coefficient of the product pattern; and selectively removing the product light interrupt film by using the product resist pattern as an etching mask, and then, forming the product pattern on the product mask substrate.

According to a fourth aspect of the present invention, there is provided A semiconductor device manufacturing method, comprising: forming a device pattern of a desired semiconductor device on a resist film formed on a wafer by using a photomask manufactured in the manufacturing method according to the third aspect; and forming a desired device on the wafer by transferring to the wafer the device pattern formed on the resist film.

BRIEF DESCRIPTION OF THE SEVERAL VIEWS OF THE DRAWINGS

FIG. 4 is a flow chart showing a photomask manufacturing method according to an embodiment of the present invention;

FIG. 5 is a second graph depicting a relationship between a global coating rate and a backward scattering coefficient according to an embodiment of the present invention;

DETAILED DESCRIPTION OF THE INVENTION

Figure 1:
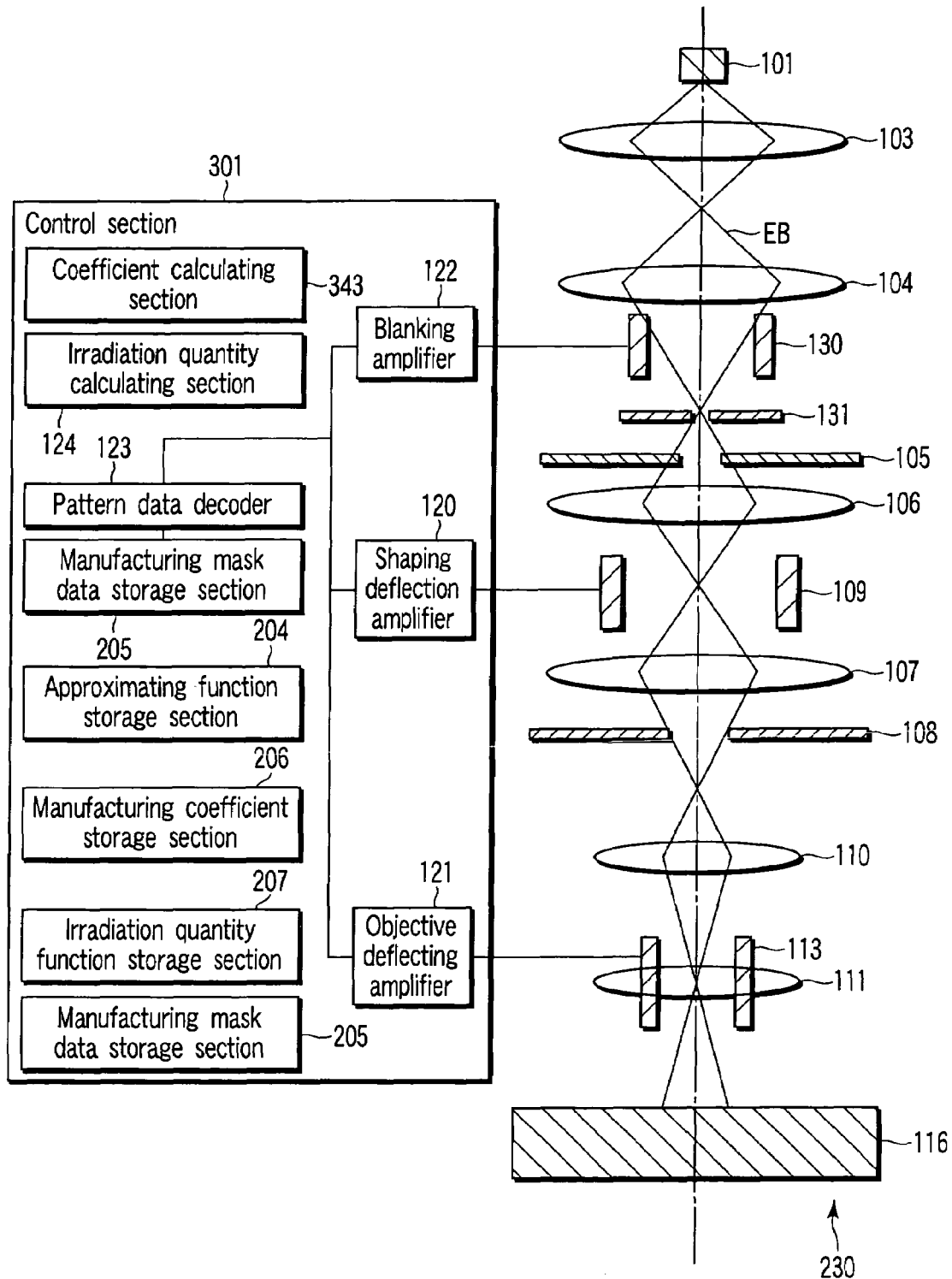
FIG. 1 is a block diagram depicting a pattern drawing system according to an embodiment of the present invention.

Hereinafter, embodiments of the present invention will be described with reference to the accompanying drawings. In the following description of the accompanying drawings, identical or like constituent elements are designated by identical or like reference numerals. The embodiments described below present an apparatus and method for instantiating a technical idea of the present invention. This technical idea does not specify allocation or the like of constituent elements as follows. The technical idea of the present invention can be variously changed in claims.

A pattern drawing system according to an embodiment of the present invention, as shown in FIG. 1, has: an electrically charged beam irradiating mechanism 230; and a control section 301 for controlling the electrically charged beam irradiating mechanism 230. The control section 301 has a coefficient calculating section 343 for calculating a backward scattering coefficient, based on an approximating function for approximating a relationship between a global pattern coating rate and a backward scattering coefficient of a charged beam as well as a global coating rate of the pattern; and an irradiation quantity calculating section 124 for calculating an irradiation quantity used for drawing a pattern by means of the electrically charged beam irradiating mechanism, based on the backward scattering coefficient of the pattern. A term "global coating rate" used here designates a coating rate of a light interrupt film on a transparent mask substrate in a range which is wider than that encompassed by a proximity effect.

The electrically charged beam irradiating mechanism 230 has an electron gun 101 for emitting electrically charged beams. A first capacitor lens 13 and a second capacitor lens 104 are allocated at the lower part of the electron beam 101. An electrically charged beam current density and a Kohler illumination condition are adjusted by passing the electrically charged beams through the first capacitor lens 103 and the second capacitor lens 104. A first shaping aperture 105 is allocated at the lower part of the second capacitor lens 104. The first shaping aperture 105 variably controls dimensions of electrically charged beams. A first projecting lens 106 and a second projecting lens 107 are allocated at the lower part of the first shaping aperture 105. Further, a second shaping aperture 108 is allocated at the lower part of the second projecting lens 107. An image of the first shaping aperture 105 formed by irradiation with electrically charged beams is formed on the second shaping aperture 108 by means of the first projecting lens 106 and the second projecting leans 107. The second shaping aperture 108 variably controls dimensions of electrically charged beams. A reduction lens 110 and an objective lens 111 are allocated at the lower part of the second shaping aperture 108. In addition, a movable stage 116 for holding a product mask substrate is allocated at the lower part of the objective lens 111. The product mask substrate is made of a transparent material such as a quartz glass, and a product light interrupt film made of chromium (Cr) or the like is deposited on a surface of the product mask substrate. In addition, a product resist film which is exposed and reacts with electrically charged beams is spin-coated on the product light interrupt film. The product resist film is made of a photo resist or the like. The electrically charged beams having passed through the second shaping aperture 108 are reductively projected by means of the reduction lens 110 and the objective lens 111, and the reductively projected image is formed on a product resist film surface on the product mask substrate.

A blanking electrode 130 and a blanking aperture 131 are allocated between the second capacitor lens 104 and the first shaping aperture 105. In stopping irradiation of electrically charged beams to the product resist film of the product mask substrate, the blanking electrode 130 reflects the electrically charged beams having passed through the second capacitor lens 104 onto the blanking aperture 131, thereby preventing the electrically charged beams from arriving at the product resist film of the product mask substrate. Irradiation of electrically charged beams to the product resist film on the product mask substrate is stopped by means of the blanking electrode 130 and the blanking aperture 131, thereby adjusting an irradiation time of electrically charged beams formed as an image on the product resist film on the product mask substrate. Then, an irradiation quantity of the electrically charged beams at an image forming point is adjusted. A shaping deflector 109 is allocated between the first projecting lens 106 and the second projecting lens 107. The shaping deflector 109 deflects the electrically charged beams having passed through the first projecting lens 106, and controls irradiation positions of the electrically charged beams on the second shaping aperture 108. An objective deflector 113 is allocated in the vicinity of the objective lens 111. The objective deflector 113 deflects the electrically charged beams molded by the first shaping aperture 105 and the second shaping aperture 108, and scans image forming positions of the electrically charged beams on the product resist film surface of the product mask substrate.

A control section 301 is connected to the electrically charged beam irradiating mechanism 230. The control section 301 has a blanking amplifier 122, a shaping deflection amplifier 120, and an objective deflecting amplifier 121. The blanking amplifier 122 applies a deflecting voltage to the blanking electrode 130, and sets the beginning and end of irradiation of electrically charged beams to the product resist film on the product mask substrate, thereby adjusting the irradiation quantity of the electrically charged beams to the product resist film. The shaping deflection amplifier 120 applies a deflecting voltage to the shaping deflector 109, and sets the shape and dimensions of the electrically charged beams irradiated to the product resist film on the product mask substrate. The objective deflecting amplifier 121 applies a deflecting voltage to the objective deflector 113, and sets scanning positions of the electrically charged beams irradiated to the product resist film on the product mask substrate.

A coefficient calculating section 343 calculates a backward scattering coefficient $\eta_M$ of a product pattern by substituting a value of a global coating rate $Z_M$ of a product pattern such as a mask pattern of a photomask produced, for an unknown number Z of a global coating rate of an approximating function given by formula (1).

$$\eta_M = C_1 \times Z + C_2 \times \log(Z+1) + C_3 \quad (1)$$

where $C_1$, $C_2$, and $C_3$ denote constants, respectively.

The irradiation quantity calculating section 124 calculates a product irradiation quantity condition $D_M$ for manufacturing a photomask by substituting a backward scattering coefficient $\eta_M$ of a product pattern for an unknown number $\eta$ of an irradiation quantity function given by formula (2) below; and substituting a local coating rate $S_M$ for the product pattern to an unknown number S of the local coating rate.

$$D_M = C_4 / (\frac{1}{2} + S \times \eta) \quad (2)$$

where $C_4$ denotes a constant. Further, the irradiation quantity calculating section 124 converts the product irradiation quantity condition $D_M$ into an irradiation time of electrically charged beams.

The control section 301 further has: an approximating function storage section 204; a manufacturing mask data storage section 205; a manufacturing coefficient storage section 206; and an irradiation quantity function storage section 207. The approximating function storage section 204 stores an approximating function given by formula (1) above. The manufacturing mask data storage section 205 stores as CAD data or the like, design data on a product pattern of a photomask manufactured by an electrically charged beam drawing device 302. In addition, this storage section also stores a local coating rate $S_M$ and a global coating rate $Z_M$ at an arbitrary position of a product pattern. The manufacturing coefficient storage section 206 stores a backward scattering coefficient $\eta_M$ of a product pattern that the coefficient calculating section 343 calculates. The irradiation quantity function storage section 207 stores an irradiation quantity function given by formula (2) above.

Figure 2:
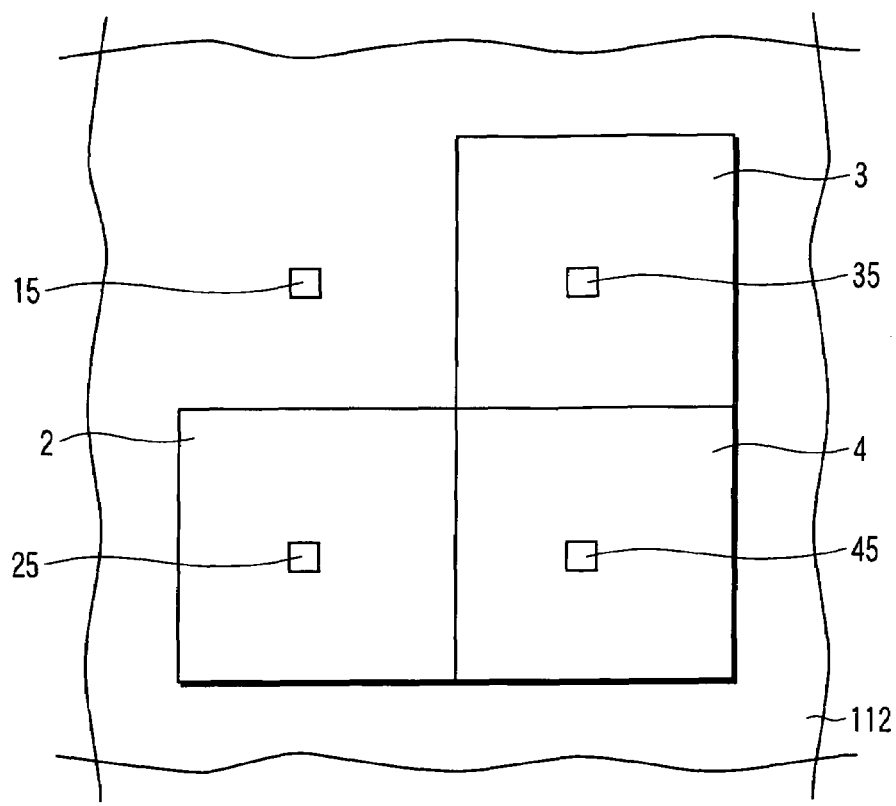
FIG. 2 is a top view of a check mask according to an embodiment of the present invention.

Now, a description will be given with how to obtain formula (1). First, a plurality of check masks shown in FIG. 2 is fabricated. The check mask has a first coating rate region 2, a second coating rate region 3, and a third coating rate region 4 which are allocated on a transparent check mask substrate 112. Here, an area of each one of the first to third coating rate regions 2 to 4 is set to be larger than the range encompassed by a "fogging effect" or the like, and is obtained as 15 mm in square, for example. Further, the check mask has: a first check pattern 15 insularly allocated on the check mask substrate 112; a second check pattern 25 surrounded by the first coating rate region 2; a third check pattern 35 surrounded by the second coating rate region 31; and a fourth check pattern 45 surrounded by the third coating rate region 4. An area of each one of the first to fourth check patterns 15 to 45 is set to be larger than the range encompassed by the proximity effect, and is obtained as 11 μm in square, for example. By setting the estimating areas to be larger than the areas encompassed by the fogging effect and the proximity effect, it is possible to reduce influences by the scattered charged beam incident externally.

When the check mask is fabricated by a pattern drawing system, the coating rate of a check light interrupt film on the check mask substrate 112 in the range encompassed by the proximity effect is defined as a "local coating rate". The first check pattern 15 is insularly allocated on the check mask substrate 112, and thus, the "global coating rate" at the periphery of the first check pattern 15 is 0%. In the first coating rate region 2, a check light interrupt film is selectively removed from the check mask substrate 112 so that the "global coating rate" is 33%. In the second coating rate region 3, a check light interrupt film is selectively removed from the check mask substrate 112 so that the "global coating rate" is 66%. In the third coating rate region 4, the "global coating rate" is 100%, and the surface of the check mask substrate 112 is covered with a check light interrupt film.

The first check pattern 15 includes three types of regions in which, for example, the "local coating rates" are 25%, 50%, and 75%, respectively, from the designing point of view. In the region in which the "local coating rate" is 25%, for example, a lattice pattern whose line and space ratio is 25:75 is provided on the check mask substrate 112. In the region in which the "local coating rate" is 50%, for example, a lattice pattern whose line and space ratio is 50:50 is provided on the check mask substrate 112. In the region in which the "local coating rate" is 75%, for example, a lattice pattern whose line and space ratio is 75:25 is provided on the check mask substrate 112.

The shape of each one of the second to fourth check patterns 25 to 45 is identical to that of the first check pattern 15.

At the time of fabricating a check mask shown in FIG. 2, a plurality of correction parameters are calculated by multiplying each one of a plurality of scaling values by a backward scattering coefficient $\eta_C$ common to the first to fourth check patterns 15 to 45, the coefficient being acquired in advance without considering a global coating rate. The term "a plurality of scaling values" used here denotes a plurality of constants obtained at intervals of 0.00001 from 0.999 to 1.001. Further, each one of a plurality of correction parameters is substituted for an unknown number $\eta$ of a backward scattering coefficient of an irradiation quantity function given by formula (2) above, thereby calculating a plurality of check irradiation quantity conditions $D_S$ for drawing each one of the first to fourth check patterns 15 to 45 with electrically charged beams.

Next, a first optimal irradiation quantity condition $D_{B1}$ for minimizing a dimensional change of the first check pattern 15 is sampled from a plurality of check irradiation quantity conditions $D_S$ by comparing actually measured value and a design value in dimensions of the first check pattern 15 shown in FIG. 2, of each one of a plurality of check masks fabricated by using the plurality of check irradiation quantity conditions $D_S$. Here, a correction parameter used in the first optimal irradiation quantity condition $D_{B1}$ is defined as a first backward scattering coefficient $\eta_{B1}$ in the first check pattern 15. Similarly, each one of a second optimal irradiation quantity condition $D_{B2}$ for minimizing a dimensional change of the second check pattern 25, a third optimal irradiation quantity condition $D_{B3}$ for minimizing a dimensional change of the third check pattern 35, and a fourth optimal irradiation quantity condition $D_{B4}$ for minimizing a dimensional change of the fourth check pattern 45 is sampled from the plurality of check irradiation quantity conditions $D_S$. Then, a correction parameter used under the second optimal irradiation quantity condition $D_{B2}$ is defined as a second backward scattering coefficient $\eta_{B2}$ in the second check pattern 25; a correction parameter used under the third optimal irradiation quantity condition $D_{B3}$ is defined as a third backward scattering coefficient $\eta_{B3}$ in the third check pattern 35; and a correction parameter used under the fourth optimal irradiation quantity condition $D_{B4}$ is defined as a fourth backward scattering coefficient $\eta_{B4}$ of the fourth check pattern 45.

Figure 3:
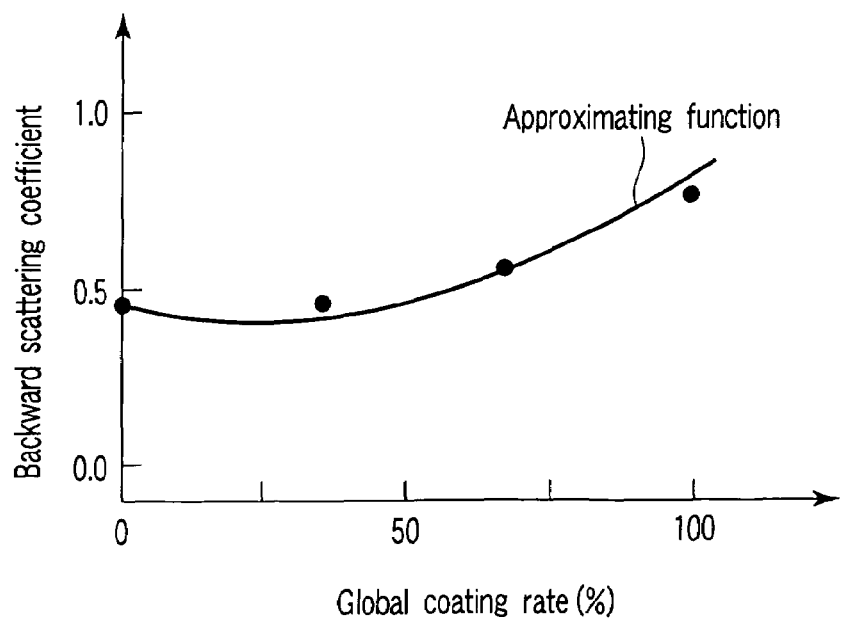
FIG. 3 is a first graph depicting a relationship between a global coating rate and a backward scattering coefficient according to an embodiment of the present invention.

Lastly, based on the first to fourth backward scattering coefficients $\eta_{B1}$ to $\eta_{B4}$ and the global coating rates at the periphery of the first to fourth check patterns 15 to 45, a relationship between the backward scattering coefficient $\eta_B$ and the global coating rate is approximated by an approximating function shown in FIG. 3, thereby calculating formula (1) above. Therefore, the approximating function storage section 204 stores the approximating function calculated in accordance with the above method.

Now, with reference to a flow chart shown in FIG. 4, a description will be given with respect to a photomask manufacturing method according to an embodiment.

(a) In step S110, a coefficient calculating section 343 reads out an approximating function from an approximating function storage section 204, and reads out a global coating rate $Z_M$ of a product pattern from a product mask data storage section 205. The coefficient calculating section 343 calculates a backward scattering coefficient $\eta_M$ by substituting a global coating rate $Z_M$ of a product pattern for an unknown number Z of the global coating rate given by formula (1). The coefficient calculating section 343 stores the calculated backward scattering coefficient $\eta_M$ of the product pattern in a manufacturing coefficient storage section 206.

(b) In step S111, a product mask substrate having a product light interrupt film deposited thereon is prepared, and a product resist film is coated on the product light interrupt film. A material for each one of the product light interrupt film, the product mask substrate, and the product resist film may be of the same types as the check light interrupt film, check mask substrate 112, and check resist film used for manufacturing the check mask shown in FIG. 2. After coating the product resist film, the product mask substrate is allocated on a movable stage 116 shown in FIG. 1.

(c) In step S112, a shaping deflection amplifier 120 and an objective deflecting amplifier 121 shown in FIG. 1 read out design data on a product pattern stored in the manufacturing mask data storage section 205, and instructs a shaping deflector 109 and an object deflector 113 shown in FIG. 1 to draw a product pattern on the product resist film.

(d) In step S113, an irradiation quantity calculating section 124 reads out a backward scattering coefficient $\eta_M$ of a product pattern from the manufacturing coefficient storage section 206, and then, substitutes the read out coefficient for an irradiation quantity function given by formula (2) above, the function being stored in an irradiation quantity function storage section 207. Further, this calculating section reads out a local coating rate $S_M$ of a product pattern at a drawing position from the manufacturing mask data storage section 205; substitutes the read out coating rate for formula (2) above; and calculates a product irradiation quantity condition $D_M$ at individual drawing positions on a product mask substrate. The irradiation quantity calculating section 124 converts the calculated product irradiation quantity condition $D_M$ into an irradiation time of a product resist film, and transfers the converted irradiation time to a blanking amplifier 122. The blanking amplifier 122 applies a voltage to a blanking electrode 130 shown in FIG. 1, and controls the irradiation time of the product resist film. By repeating drawing, a pattern drawing system draws a product mask pattern that corresponds to a product pattern on a product resist film on the product mask substrate.

(e) In step S114, the product resist film coated on each one of the product mask substrates is processed to be developed by means of a developing device, and a product resist pattern is formed. The product resist pattern is produced as an etching mask, and a product light interrupt film having a product mask substrate covered therewith is selectively removed. Then, a photomask having a product pattern is fabricated, and a photomask manufacturing method according to the present embodiment is terminated.

Figure 6:
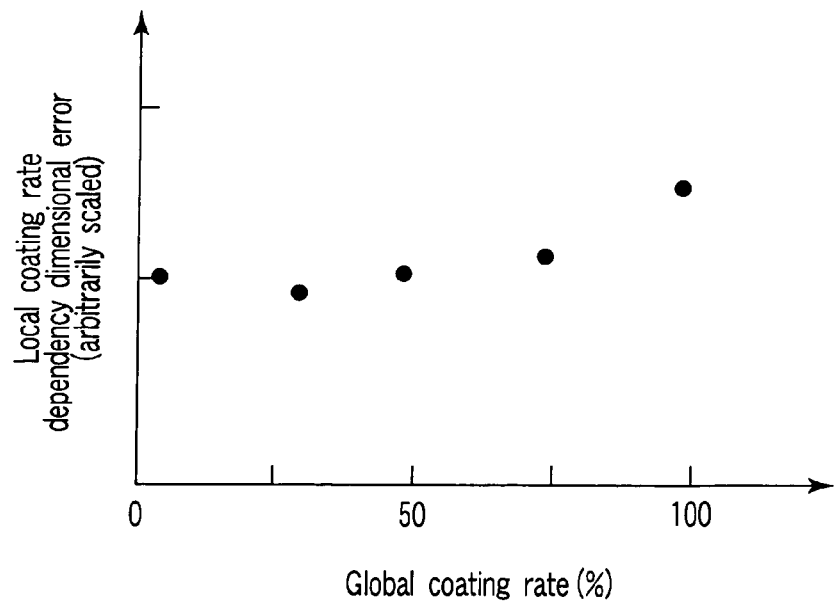
FIG. 6 is a first graph depicting a relationship between a global coating rate and a local coating rate dependency dimensional error according to an embodiment of the present invention.
Figure 7:
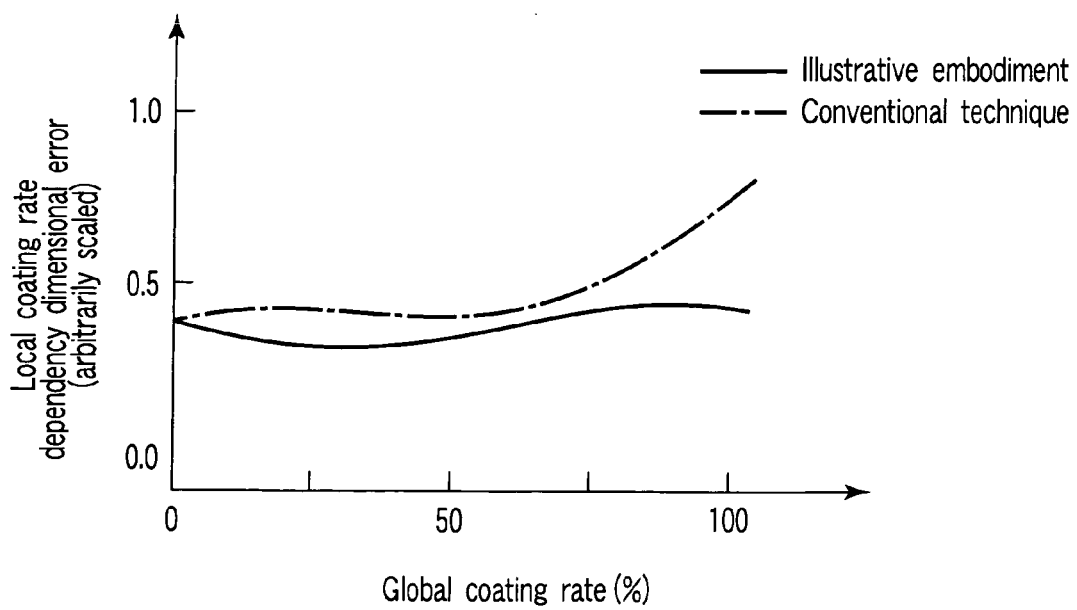
FIG. 7 is a second graph depicting a relationship between a global coating rate and a local coating rate dependency dimensional error according to an embodiment of the present invention.

As described above, according to the pattern drawing system and photomask manufacturing method according to the embodiment shown in FIGS. 1 and 4, it becomes possible to reduce a dimensional change depending on a global coating rate to the minimum and to restrict a proximity effect depending on a local coating rate. For example, at the time of forming a pattern on a glass substrate by using electrically charged beams, in the case where an attempt is made to restrict dimensional changes in both of the proximity effect depending on the local coating rate, the periphery of which is within the range of 11 μm and the fogging effect depending on the global coating rate, the periphery of which is within the range of 15 mm by an irradiation quantity correcting method, a backward scattering coefficient $\eta_B$ for use in proximity effect correction changes depending on the global coating rate, as shown in FIG. 5. However, in the proximity effect correction using a conventional irradiation quantity correcting method, a backward scattering coefficient η has been used as a constant value acquired without considering an effect of a global coating rate. Therefore, a difference between the backward scattering coefficient η acquired without considering an effect of a global coating rate and an actual backward scattering coefficient $\eta_B$ has been produced as a proximity effect correction error, causing degradation of dimensional precision. As a result, in the case where the backward scattering coefficient η acquired without considering an effect of a global coating rate has been used for proximity effect correction, as shown in FIG. 6, a global coating rate has risen and a dimensional error has risen due to a proximity effect correction error. In contrast, according to the pattern drawing system and photomask manufacturing method according to the embodiment shown in FIGS. 1 and 4, proximity effect correction is carried out by calculating the backward scattering coefficient $\eta_B$ in consideration of a global coating rate in step S110 in FIG. 4; and calculating the product irradiation quantity condition $D_M$ based on the backward scattering coefficient $\eta_B$ and a local coating rate in step S113. Therefore, as shown in FIG. 7, as compared with a conventional case in which proximity effect correction has been carried out by using the backward scattering coefficient η acquired without considering an effect of a global coating rate, it becomes possible to restrict a dimensional error caused by a proximity effect correction error even in the case where the global coating rate has risen.

OTHER EMBODIMENTS

As described above, while the embodiments of the present invention have been described, it should not be understood that discussion and accompanying drawings forming part of this disclosure limits the present invention. In view of this disclosure, a variety of alternative aspects, embodiments, and operational techniques will be obvious to one skilled in the art. For example, the first to fourth check patterns 15 t 45 shown in FIG. 2 may be arbitrarily shaped. Namely, these patterns may be formed in the shape of circuit patterns without being limited to the lattice patterns. In addition, the pattern drawing system shown in FIG. 1 can be applied to a semiconductor device manufacturing process by changing the check mask substrate 112 to a silicon wafer. Further, the irradiation quantity function for the irradiation quantity calculating section 124 to use for calculation of the product irradiation quantity condition $D_M$ is not limited to formula (2), and a proper function can be utilized depending on individual type of the pattern drawing system. Therefore, in view of the foregoing description, the technical scope of the present invention is defined by only the specific matters of the invention according to reasonable claims.

Further, according to the present invention, a device pattern of a desired semiconductor device is formed on a resist film formed on a semiconductor wafer by using a photomask manufactured using the manufacturing method according to the embodiments, and the device pattern formed on this resist film is transferred to a wafer, whereby a desired semiconductor device can be formed on the wafer.

In addition, according to the present invention, instead of manufacturing the photomask, a semiconductor device can be manufactured by directly irradiating electrically charged beams to the resist film formed on the wafer and forming a device pattern.

Similarly, this semiconductor device can be manufactured by calculating the backward scattering coefficient of the pattern, based on: an approximating function for approximating a relationship between a global coating rate in a range whose range is wider than that of a proximity effect and a backward scattering coefficient; and the global coating rate of the pattern; and by calculating a beam irradiation quantity used for drawing the pattern with the electrically charged beams, based on the backward scattering coefficient of the pattern.

What is claimed is:

1. A pattern drawing system, comprising:
   an electrically charged beam irradiating mechanism;
   a coefficient calculating section which, based on an approximating function for approximating a relationship between a global pattern coating rate in a range wider than that of a proximity effect and a backward scattering coefficient and based on a global coating rate of a pattern, calculates the backward scattering coefficient of the pattern; and
   an irradiation quantity calculating section which, based on the backward scattering coefficient of the pattern, calculates a beam irradiation quantity used for drawing the pattern using the electrically charged beams;
   wherein the coefficient calculating section calculates the backward scattering coefficient, which is represented by $\eta M$, based on a formula showing a relationship between the global pattern coating rate, which is represented by Z, and the backward scattering coefficient $\eta M$, i.e., $\eta M = C1 \times Z + C2 \times \log(Z+1) + C3$, where C1, C2, and C3 denote constants, respectively; and
   wherein the coefficient calculating section include a unit which obtains the approximating function formula using a check mask formed on a check mask substrate, wherein the check mask includes a plurality of check patterns having similar shapes with each other, the check patterns includes a first pattern having a plurality of proximity effect areas with different local coating rates, the first pattern is formed in a first area of 0% global coating rate, and the remaining patterns include a plurality of fogging effect areas with different global coating rates selected from a value not less than 0% and not larger than 100%.

2. An electrically charged beam drawing method, comprising:
   calculating a backward scattering coefficient of a product pattern based on: an approximating function for approximating a relationship between a global coating rate and the backward scattering coefficient, and the global coating rate of the product pattern;
   calculating a product irradiation quantity condition for use in drawing the product pattern based on the backward scattering coefficient of the product pattern; and
   drawing the product pattern by using the product irradiation quantity condition.

3. The electrically charged beam drawing method according to claim 2, comprising:
   drawing a plurality of check patterns having the global coating rates which are different from each other, by using electrically charged beams, under a plurality of check irradiation quantity conditions corrected with respect to a proximity effect;
   extracting an optimal irradiation quantity condition for restricting a dimensional change of each one of said plurality of check patterns from said plurality of check irradiation quantity conditions; and
   acquiring the approximating function in a respective one of said plurality of check patterns, based on the optimal irradiation quantity condition.

4. The electrically charged beam drawing method according to claim 2, wherein the backward scattering coefficient is calculated based on a formula showing a relationship between the global coating rate, which is represented by Z, and the backward scattering coefficient, which is represented by $\eta M$, i.e., $\eta M = C1 \times Z + C2 \times \log(Z+1) + C3$, where C1, C2, and C3 denote constants, respectively.

5. The electrically charged beam drawing method according to claim 4, wherein the irradiation quantity is determined based on the backward scattering coefficient $\eta M$ obtained in the calculating.

6. The electrically charged beam drawing method according to claim 2, wherein calculation of the product irradiation quantity includes acquiring a local coating rate in a range encompassed by the proximity effect in the product pattern.

7. The electrically charged beam drawing method according to claim 4, wherein the coefficient calculating includes obtaining an approximating function formula using a check mask formed on a check mask substrate, the check mask including a plurality of check patterns having similar shapes with each other, the check patterns including a first pattern having a plurality of proximity effect areas with different local coating rates, the first pattern being formed in a first area of 0% global coating rate, and remaining patterns including a plurality of fogging effect areas with different global coating rates selected from a value not less than 0% and not larger than 100%.

8. A photomask manufacturing method, comprising:
   calculating a backward scattering coefficient of a product pattern based on: an approximating function for approximating a relationship between a global coating rate and the backward scattering coefficient, and the global coating rate of the product pattern;
   coating a product resist film on a product mask substrate coated with a product light interrupt film;
   irradiating the product resist film with a charged beam to form a product resist pattern under a product irradiation quantity condition calculated based on the backward scattering coefficient of the product pattern; and selectively removing the product light interrupt film by using the product resist pattern as an etching mask, and then, forming the product pattern on the product mask substrate.

9. The photomask manufacturing method according to claim 8, wherein the acquisition of the approximating function for approximating the relationship between the global coating rate and the backward scattering coefficient includes:

drawing a plurality of check patterns having the global coating rates which are different from each other by using electrically charged beams under a plurality of check irradiation quantity conditions corrected with respect to a proximity effect;

obtaining an optimal irradiation quantity condition for restricting a dimensional change of each one of said plurality of check patterns from said plurality of check irradiation quantity conditions; and acquiring the approximating function in each one of said plurality of check patterns, based on the optimal irradiation quantity condition.

10. The photomask manufacturing method according to claim 8, wherein the backward scattering coefficient is calculated based on a formula showing a relationship between the global coating rate, which is represented by $Z$, and the backward scattering coefficient, which is represented by $\eta M$, i.e., $\eta M = C1 \times Z + C2 \times \log(Z+1) + C3$, where $C1$, $C2$, and $C3$ denote constants, respectively.

11. The photomask manufacturing method according to claim 10, wherein the product beam irradiation quantity is determined based on the backward scattering coefficient $\eta M$ obtained by calculation.

12. The photomask manufacturing method according to claim 10, wherein the coefficient calculating includes obtaining the approximating function formula using a check mask formed on a check mask substrate, the check mask including a plurality of check patterns having similar shapes with each other, the check patterns including a first pattern having a plurality of proximity effect areas with different local coating rates, the first pattern being formed in a first area of 0% global coating rate, and remaining patterns including a plurality of fogging effect areas with different global coating rates having a value not less than 0% and not larger than 100%.

13. A semiconductor device manufacturing method, comprising:

forming a device pattern of a desired semiconductor device on a resist film formed on a wafer by using a photomask manufactured in the manufacturing method according to claim 8; and forming a desired device on the wafer by transferring to the wafer the device pattern formed on the resist film.

14. A semiconductor device manufacturing method, comprising:

calculating a backward scattering coefficient of a pattern based on an approximating function for approximating a relationship between a global coating rate in a range wider than that of a proximity effect and the backward scattering coefficient, and based on the global coating rate of the pattern; and calculating a beam irradiation quantity used for drawing the pattern using the electrically charged beams based on the backward scattering coefficient of the pattern, to form a device pattern by irradiating electrically charged beams to a resist film formed on a wafer.

* * * * *